United States Patent
Park et al.

(10) Patent No.: US 8,623,773 B2
(45) Date of Patent: Jan. 7, 2014

(54) ETCHANT FOR METAL LAYER INCLUDING COPPER OR A COPPER ALLOY, METHOD OF MANUFACTURING A DISPLAY SUBSTRATE USING THE SAME AND DISPLAY SUBSTRATE

(75) Inventors: Hong-Sick Park, Suwon-si (KR);
Wang-Woo Lee, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/438,405

(22) Filed: Apr. 3, 2012

(65) Prior Publication Data
US 2013/0015471 A1 Jan. 17, 2013

(30) Foreign Application Priority Data
Jul. 15, 2011 (KR) .............................. 2011-0070228

(51) Int. Cl.
*H01L 21/302* (2006.01)

(52) U.S. Cl.
USPC ................ 438/754; 438/687; 257/E21.309

(58) Field of Classification Search
USPC ........... 438/749, 751; 257/E21.299, E21.305, 257/E21.483
See application file for complete search history.

(56) References Cited

U.S. PATENT DOCUMENTS
2010/0159624 A1* 6/2010 Cho et al. ........................ 438/34

FOREIGN PATENT DOCUMENTS
JP 2009218601 A * 9/2009

* cited by examiner

*Primary Examiner* — Cheung Lee
(74) *Attorney, Agent, or Firm* — F. Chau & Associates, LLC

(57) ABSTRACT

An etchant includes about 50% by weight to about 70% by weight of phosphoric acid, about 1% by weight to about 5% by weight of nitric acid, about 10% by weight to about 20% by weight of acetic acid, about 0.1% by weight to about 2% by weight of a corrosion inhibition agent including an azole-based compound and a remainder of water.

13 Claims, 12 Drawing Sheets

ETCHANT FOR METAL LAYER INCLUDING COPPER OR A COPPER ALLOY, METHOD OF MANUFACTURING A DISPLAY SUBSTRATE USING THE SAME AND DISPLAY SUBSTRATE

CROSS-REFERENCE TO RELATED APPLICATION

This application claims priority under 35 U.S.C. §119 to Korean Patent Application No. 2011-0070228, filed on Jul. 15, 2011, the disclosure of which is hereby incorporated by reference herein in it's entirety.

BACKGROUND OF THE INVENTION

1. Technical Field

Example embodiments of the present invention relate to an etchant for a metal layer including copper or a copper alloy, a method of manufacturing a display substrate using the etchant and a display substrate. More particularly, example embodiments of the present invention relate to an etchant for a metal layer including copper or copper alloy, which may be used in a manufacturing process for a display substrate, a method of manufacturing a display substrate using the etchant and a display substrate.

2. Description of the Related Art

Generally, a display panel includes a display substrate including a thin-film transistor as a switching element for driving a pixel. The display substrate may include a plurality of metal patterns, which are generally formed through a photolithography process. According to the photolithography process, a photoresist layer is formed on a film, which is an object of etching, and the photoresist layer is exposed to light and developed to form a photoresist pattern, and the film is etched by an etchant through the photoresist pattern as an etch-stopping layer.

When the film, which is an object of etching, includes copper, an etchant for the film may include a peroxide etchant and a non-peroxide etchant. The peroxide etchant may cause an explosion due to a chemical reaction caused when the peroxide etchant etches the film including copper. When the conventional non-peroxide etchant is used, a cumulative amount of etched films may be small. Furthermore, the conventional non-peroxide etchant may have a low storage stability at a room temperature, and the composition of the non-peroxide etchant may need to be changed depending on the thickness of the film.

SUMMARY OF THE INVENTION

Example embodiments of the present invention provide an etchant for a metal layer including copper or a copper alloy, and the etchant being capable of forming a fine pattern.

Example embodiments of the present invention further provide a method of manufacturing a display substrate using the etchant.

Example embodiments of the present invention further provide a display substrate including a metal pattern etched by the etchant.

According to an example embodiment of the present invention, an etchant includes about 50% by weight to about 70% by weight of phosphoric acid, about 1% by weight to about 5% by weight of nitric acid, about 10% by weight to about 20% by weight of acetic acid, about 0.1% by weight to about 2% by weight of a corrosion inhibition agent including an azole-based compound and a remainder of water.

In an example embodiment, the corrosion inhibition agent includes benzotriazole.

In an example embodiment, the etchant further includes about 0.2% by weight to about 2% by weight of a fluorine-containing compound.

In an example embodiment, a metal layer which may be etched by the etchant includes copper or a copper alloy and has one of a single-layered structure including a copper layer, a double-layered structure including a copper layer disposed on a molybdenum layer, a double-layered structure including a copper layer disposed on a titanium layer, a double-layered structure including a copper layer disposed on a molybdenum alloy layer or a double-layered structure including a copper layer disposed on a titanium alloy layer.

According to an example embodiment of the present invention, a method of manufacturing a display substrate is provided. According to the method, a metal layer including copper or a copper alloy is formed on a substrate. The metal layer is patterned by an etchant to form a metal pattern. The etchant includes about 50% by weight to about 70% by weight of phosphoric acid, about 1% by weight to about 5% by weight of nitric acid, about 10% by weight to about 20% by weight of acetic acid, about 0.1% by weight to about 2% by weight of a corrosion inhibition agent including an azole-based compound and a remainder of water.

In an example embodiment, a protective layer including benzotriazole combined with copper or a copper alloy is formed on an etched surface of the metal pattern.

According to an example embodiment of the present invention, a display substrate includes a switching element and a protective layer. The switching element includes a first electrode, a second electrode and a third electrode, and the first electrode, the second electrode and the third electrodes each include a first metal layer. The protective layer includes an azole-based compound combined with copper or a copper alloy, and is formed on an etched surface of at least one of the first electrode, the second electrode and the third electrode.

In an example embodiment, at least one of the first electrode, the second electrode and the third electrode further includes a second metal layer including molybdenum, titanium, molybdenum alloy or titanium alloy.

In an example embodiment, the first metal layer is disposed on the second metal layer.

In an example embodiment, the azole-based compound includes benzotriazole.

In accordance with an example embodiment of the present invention, a method for manufacturing a display substrate is provided. The method includes forming a gate metal layer including copper or a copper alloy on a base substrate, forming a first photoresist pattern on the gate metal layer, etching a portion of the gate metal layer exposed by the first photoresist pattern using an etchant to form a gate line, a gate electrode and a gate pad electrode on the base substrate. The etchant includes about 50% by weight to about 70% by weight of phosphoric acid, about 1% by weight to about 5% by weight of nitric acid, about 10% by weight to about 20% by weight of acetic acid, about 0.1% by weight to about 2% by weight of a corrosion inhibition agent including an azole-based compound and a remainder of water. The method further includes forming a first protective layer on a side surface of the gate line, the gate electrode and the gate pad electrode, forming a first insulating layer on the gate line, the gate electrode and the gate pad electrode, forming an active pattern including a semiconductor layer and an ohmic contact layer on the first insulating layer, forming a data metal layer including copper or a copper alloy on the active pattern and the first insulating layer, forming a second photoresist pattern on the data metal layer, etching a portion of the data metal layer exposed by the second photoresist pattern using the etchant to form a data line, a source electrode, a drain electrode, and a data pad electrode on the base substrate; and forming a second protective layer on a side surface of the data line, the source electrode, the drain electrode and the data pad electrode.

According to example embodiments of the present invention, a metal layer including copper or a copper alloy may be etched by a same etchant even if a thickness of the metal layer is changed.

Furthermore, a skew length of the metal layer including copper or a copper alloy is reduced so that a fine pattern having a low resistance may be formed.

Furthermore, a cumulative treatable amount is increased to reduce manufacturing costs.

BRIEF DESCRIPTION OF THE DRAWINGS

Example embodiments of the present invention can be understood in more detail from the following detailed description when taken in conjunction with the accompanying drawings, in which.

DETAILED DESCRIPTION OF EXAMPLE EMBODIMENTS OF THE INVENTION

Figure 1:
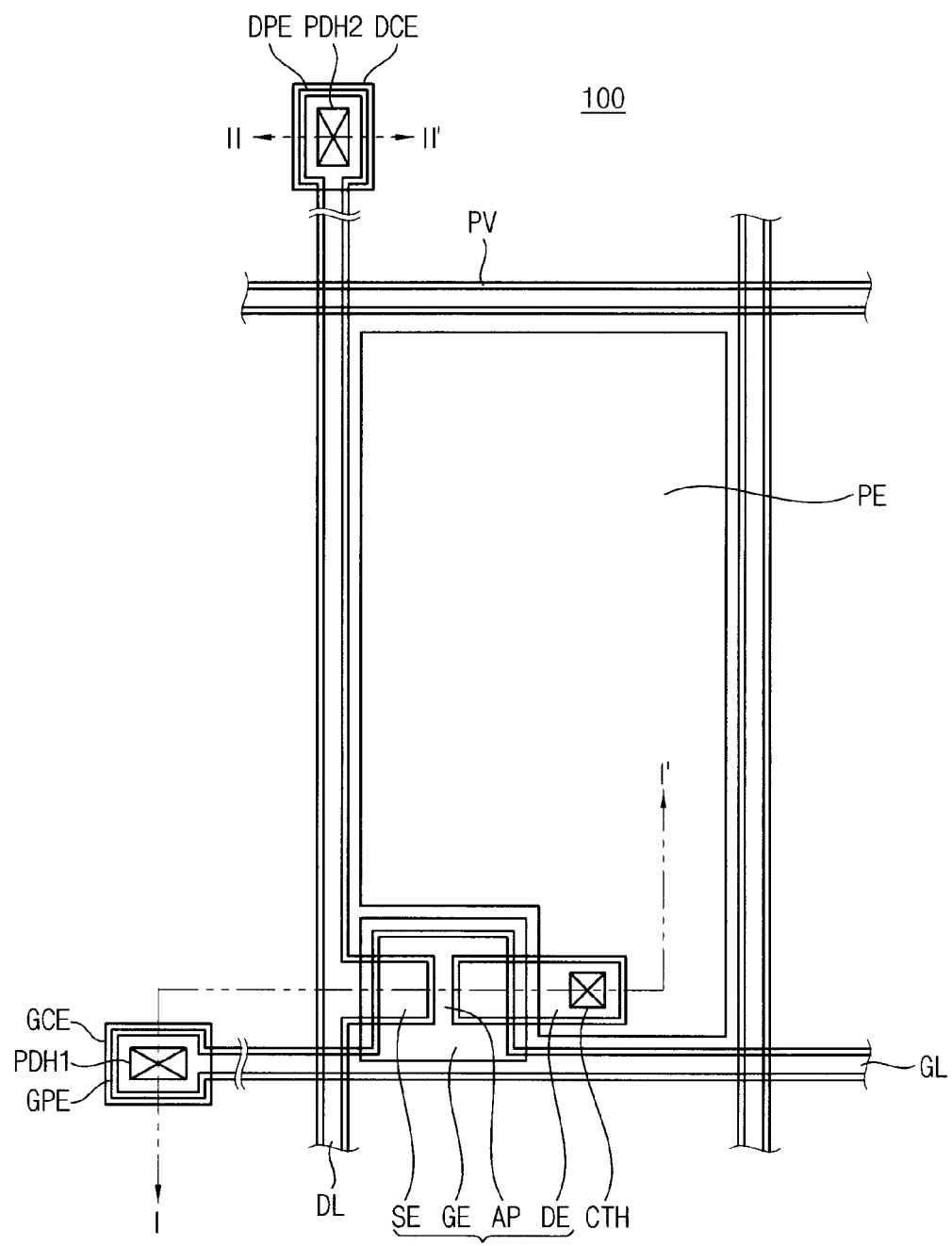
FIG. 1 is a plan view illustrating a display substrate manufactured by a method according to an example embodiment of the present invention.

Hereinafter, an etchant according to an example embodiment of the present invention will be explained with reference to experimental results. Thereafter, a method of manufacturing a display substrate using the etchant will be explained.

An etchant according to an example embodiment of the present invention includes, for example, phosphoric acid, nitric acid, acetic acid, a corrosion inhibition agent and water.

The phosphoric acid, the nitric acid and the acetic acid in the etchant mainly etch a metal film including, for example, copper or a copper alloy. It is noted that the metal film in the present example embodiment includes copper or a copper alloy but example embodiments of the present invention are not limited thereto but rather the etchant of example embodiments of the present invention may also be used on other metal films used in the manufacture of a display substrate. The phosphoric acid serves as a main oxidizer oxidizing copper or a copper alloy to etch the copper or the copper alloy. The nitric acid serves as an auxiliary oxidizer which oxidizes copper or a copper alloy to thereby etch the copper or the copper alloy, and cooperates with the phosphoric acid thereby adjusting an etching rate, a side etching and a taper angle. The acetic acid serves as a buffer adjusting an etching rate. The phosphoric acid, the nitric acid and the acetic acid may be prepared according to a conventional method known in the art. The contents of the phosphoric acid, the nitric acid and the acetic acid may be determined such that stability of the etchant is not deteriorated.

When the content of the phosphoric acid is less than about 50% by weight based on a total weight of the etchant, the etching rate is reduced so that the metal film including copper or a copper alloy is not sufficiently etched. When the content of the phosphoric acid is greater than about 70% by weight based on the total weight of the etchant, the metal film including copper or a copper alloy is excessively etched. Thus, it may be difficult to obtain a desired profile of a pattern. Therefore, the content of the phosphoric acid should be about 50% to about 70% based on the total weight of the etchant.

When the content of the nitric acid is less than, for example, about 1% by weight based on the total weight of the etchant, the etching rate is reduced so that the metal film including copper or a copper alloy is not sufficiently etched. When the content of the nitric acid is greater than, for example, about 5% by weight based on the total weight of the etchant, a photoresist may be peeled off. Thus, a metal pattern formed from the metal film may be disconnected in a following process, or the size of the metal pattern may be excessively reduced such that the metal pattern may not sufficiently serve as an electrode. Therefore, the content of the nitric acid should be about 1% to about 5% based on the total weight of the etchant.

When the content of the acetic acid is less than about 10% by weight based on the total weight of the etchant, the uniformity of a metal pattern formed from the metal film is reduced. When the content of the acetic acid is greater than about 20% by weight based on the total weight of the etchant, a bubble is generated in the course of etching the metal film. When the bubble is disposed between adjacent fine patterns, a gap between the adjacent fine patterns may not be etched. Therefore, the content of the acetic acid should be about 10% to about 20% based on the total weight of the etchant.

The corrosion inhibition agent may prevent the metal from being rapidly etched by the phosphoric acid, the nitric acid and the acetic acid.

The corrosion inhibition agent may include, for example, an azole-based compound. Examples of the corrosion inhibition agent may include but are not limited to aminotetrazole, benzotriazole (BTA), tolytriazole, pyrazole, pyrrole, imidazole, 2-methyl imidazole, 2-ethyl imidazole, 2-propyl imidazole, 2-amino imidazole, 4-metyl imidazole, 4-ethyl imidazole, 4-propyl imidazole and the like. These can be used each alone or in a combination thereof. For example, the corrosion inhibition agent may include BTA.

When the content of the corrosion inhibition agent is less than 0.1% by weight based on the total weight of the etchant, the corrosion inhibition agent cannot substantially prevent corrosion of the metal pattern so that a critical dimension loss is increased. When the content of the corrosion inhibition agent is greater than 2% by weight based on the total weight of the etchant, the metal pattern may not be etched, or an etching rate may be excessively reduced. Therefore, the content of the corrosion inhibition agent should be about 0.1% to about 2% based on the total weight of the etchant.

The etchant also includes water together with the phosphoric acid, the nitric acid, the acetic acid and the corrosion inhibition agent. Water in the etchant is not limited to a specific type of water. For example, deionized water may be used in the etchant. In addition, deionized water having a specific resistance of, for example, more than 18 MΩ/cm may be used in the etchant. The content of the water is determined according to the contents of the phosphoric acid, the nitric acid, the acetic acid and the corrosion inhibition agent. For example, the content of the water may be a reminder obtained by subtracting the contents of the phosphoric acid, the nitric acid, the acetic acid and the corrosion inhibition agent from the total weight of the etchant.

In an embodiment, the etchant may further include a fluorine-containing compound together with the phosphoric acid, the nitric acid, the acetic acid, the corrosion inhibition agent and water. The fluorine-containing compound may serve to etch a metal film including, for example, a titanium layer, a molybdenum layer, a titanium alloy layer or a molybdenum alloy layer. For example, the metal film may include a titanium layer and a copper layer or a copper alloy layer.

Any compound that can generate a fluorine ion or a multiatom-fluorine ion through dissociation in a solution may be used for the fluorine-containing compound. Examples of the fluorine-containing compound may include but are not limited to hydrogen fluoride (HF), ammonium fluoride ($NH_4F$), sodium fluoride (NaF), potassium fluoride (KF), ammonium hydrogen fluoride ($NH_4FHF$), sodium hydrogen fluoride (NaFHF), potassium hydrogen fluoride (KFHF) and the like. These can be used each alone or in a combination thereof. For example, the fluorine-containing compound may include $NH_4F$, KF or $NH_4FHF$.

When the content of the fluorine-containing compound is less than about 0.2% by weight based on the total weight of the etchant, an etching residue may be generated. When the content of the fluorine-containing compound is greater than about 2% by weight based on the total weight of the etchant, a base substrate including glass may be etched. Therefore, the content of the corrosion inhibition agent should be about 0.2% to about 2% based on the total weight of the etchant.

Alternatively, in an embodiment, the etchant may further include an additive together with the phosphoric acid, the nitric acid, the acetic acid, the corrosion inhibition agent and water. For example, the additive may include a surfactant, a sequestering agent, etc. Suitable surfactants which may be included in the etchant of example embodiments of the present invention may be selected from, for example, non-ionic surfactants, cationic surfactants, amphoteric surfactants and anionic surfactants. The surfactant reduces a surface tension thereby increasing etching uniformity. In addition, suitable sequestering agents which may be included in the etchant of example embodiments of the present invention may be, for example, derivatives of polycarboxylic acid, amino acetic acid, or nitrilo-triacetic acid. When the content of the additive is less than, for example, about 0.0001% by weight based on the total weight of the etchant, a desired effect is hardly achieved. When the content of the additive is greater than about 0.01% by weight based on the total weight of the etchant, the chemical stability of the etchant may be reduced. Thus, the content of the additive should be about 0.0001% to about 0.01% based on the total weight of the etchant. When the etchant further includes the additive, the content of the water may be a reminder obtained by subtracting the contents of the phosphoric acid, the nitric acid, the acetic acid, the corrosion inhibition agent and the additive from the total weight of the etchant.

Hereinafter, the present invention will be explained in detail with reference to the accompanying drawings.

Figure 2:
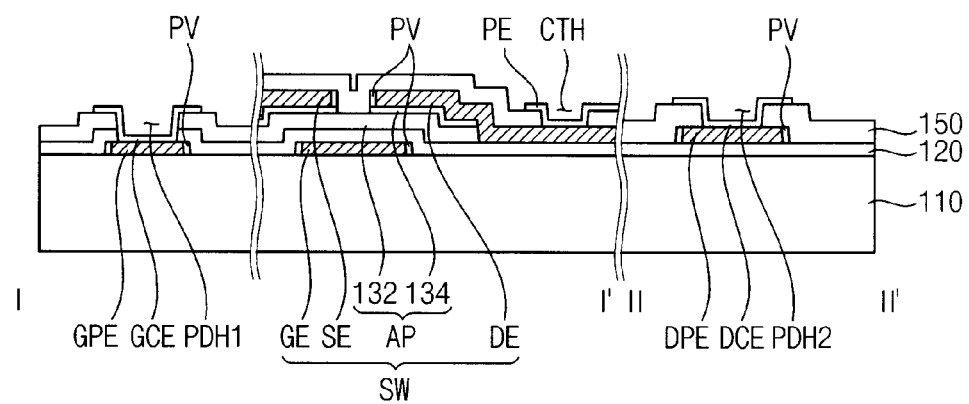
FIG. 2 is a cross-sectional view taken along a line I-I' of FIG. 1.

FIG. 1 is a plan view illustrating a display substrate manufactured by a method according to an example embodiment of the present invention. FIG. 2 is a cross-sectional view taken along a line I-I' of FIG. 1.

Referring to FIGS. 1 and 2, a display substrate 100 includes, for example, a gate line GL, a data line DL, a switching element SE and a pixel electrode PE. The display substrate 100 may further include, for example, a gate pad electrode GPE and a data pad electrode DPE.

The gate line GL extends, for example, in a first direction D1 on the display substrate 100, and the date line GL extends, for example, in a second direction D2 different from the first direction D1. Alternatively, the gate line GL may have a plurality of 'V' shaped patterns and may extend, for example, in the first direction D1 thereby forming a zigzag pattern, and the data line DL may extend, for example, in the second direction D2. Alternatively, the data line may have a plurality of 'V' shaped patterns and may extend, for example, in the second direction D2 thereby forming a zigzag pattern. Furthermore, in accordance with example embodiments of the present invention, the data line DL may instead extend in the first direction D1 and the gate line GL may instead extend in the second direction D2.

The switching element SW is electrically connected to the gate line GL, the date line DL and the pixel electrode PE. The switching element SW includes, for example, a gate electrode GE, a source electrode SE, an active pattern AP and a drain electrode DE. The gate electrode GE is connected to the gate line GL, and the source electrode SE is connected to the data line DL. The drain electrode DE is spaced apart from the source electrode SE. The active pattern AP is disposed under the source and drain electrodes SE and DE, and is partially exposed through a gap between the source and drain electrodes SE and DE. The active pattern AP may include, for example, a semiconductor layer 132 and an ohmic contact layer 134. Herein, the semiconductor layer 132 may be formed of, for example, amorphous silicon, and the ohmic contact layer 134 may be formed of, for example, amorphous silicon doped with n-type or p-type impurities. The drain electrode DE makes contact with the pixel electrode PE through a contact hole so that the switching element SW is electrically connected to the pixel electrode PE.

The gate line GL, the gate electrode GE and the gate pad electrode GPE may be formed, for example, from the same gate metal layer. The gate metal layer includes, for example, a single-layered metal layer. The single-layered metal layer may include, for example, copper or a copper alloy. Alternatively, the gate metal layer may instead include, for example, a double-layer structure composed of two metal layers sequentially stacked or a triple-layered metal layer structure composed of three metal layers sequentially stacked and at least one of the metal layers in the double or triple-layered structure includes copper or a copper alloy.

The data line DL, the source electrode SE, the drain electrode DE and the data pad electrode DPE may be formed from, for example, the same data metal layer. The data metal layer includes, for example, a single-layered metal layer. The single-layered metal layer may include, for example, copper or a copper alloy. Alternatively, the data metal layer may instead include, for example, a double-layer structure composed of two metal layers sequentially stacked or a triple-layered metal layer structure composed of three metal layers sequentially stacked and at least one of the metal layers in the double or triple-layered structure includes copper or a copper alloy.

The etchant according to an example embodiment of the present invention may be used in a process for forming a gate pattern including, for example, the gate line GL, the gate electrode GE and the gate pad electrode GPE, and in a process for forming a data pattern including, for example, the data line DL, the source electrode SE, the drain electrode DE and the data pad electrode DPE.

The active pattern AP is formed under the source and drain electrodes SE and DE. Side etched surfaces of the source electrode SE, the drain electrode DE and the active pattern AP may substantially coincide with each other in a plan view.

The display substrate 100 further includes, for example, a first insulating layer 120 and a second insulating layer 150. The first insulating layer 120 is formed on the base substrate 110 having the gate line GL, the gate electrode GE and the gate pad electrode GPE. The data line DL, the source electrode SE, the drain electrode DE and the data pad electrode DPE are formed on the first insulating layer 120, and the second insulating layer 150 is formed on the base substrate 110 having the data line DL, the source electrode SE, the drain electrode DE and the data pad electrode DPE. The first insulating layer 120 and the second insulating layer 150 may be each formed of, for example, one of silicon nitride ($SiN_x$), silicon oxide ($SiO_x$), silicon oxynitride (SiON) and tantalum oxide (TaO).

The first and second insulating layers 120 and 150 has a first pad hole PDH1 exposing a portion of the gate pad electrode GPE. Thus, the first pad hole PDH1 is formed through the first and second insulating layers 120 and 150. The second insulating layer 150 has a second pad hole PDH2 exposing a portion of the data pad electrode DPE, and a contact hole CTH exposing a portion of the drain electrode DE. Thus, the second pad hole PDH2 and the contact hole CTH are formed through the second insulating layer 150.

The pixel electrode PE is formed on the second insulating layer 150 having the contact hole CTH according to a matrix configuration. The pixel electrode PE may be, for example, partially overlapped with the gate line GL and the data line DL. The pixel electrode PE may make contact with the drain electrode DE through the contact hole CTH.

The pixel electrode PE may include, for example, an indium oxide layer. Examples of a material that may be used for the indium oxide layer may include but are not limited to indium tin oxide (ITO), indium zinc oxide (IZO) and the like. Alternatively, the pixel electrode PE may include, for example, a zinc oxide (ZnO) layer, an indium oxide ($In_2O_3$) layer, tin oxide ($SnO_2$) layer, aluminum zinc oxide (AZO) layer or a gallium zinc oxide (GZO) layer.

A gate contact electrode GCE is formed on the second insulating layer 150 overlapping with the gate pad electrode GPE, and the gate contact electrode GCE makes contact with the gate pad electrode GPE through the first pad hole PDH1. A data contact electrode DCE is on the second insulating layer 150 overlapping with the data pad electrode DPE, and the data contact electrode DCE makes contact with the data pad electrode DPE through the second pad hole PDH2.

Hereinafter, the method of manufacturing the display substrate illustrated in FIG. 2 using the etchant according to an example embodiment of the present invention will be explained in detail with reference to FIGS. 3A to 3E.

FIGS. 3A to 3E are cross-sectional views illustrating the method of manufacturing the display substrate illustrated in FIG. 2.

Figure 3A:
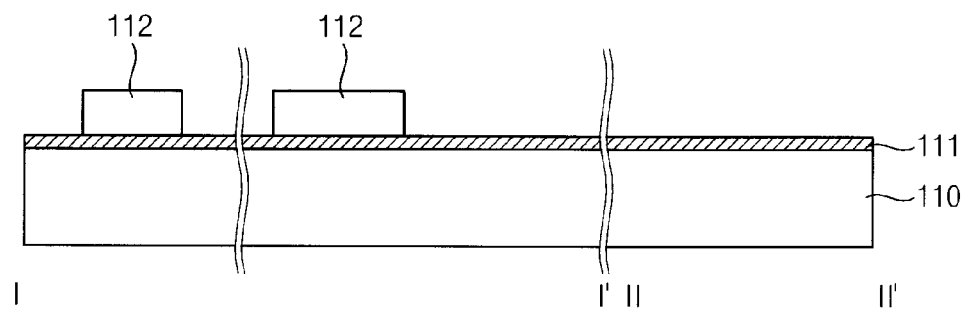
FIGS. 3A to 3E are cross-sectional views illustrating the method of manufacturing the display substrate illustrated in FIG. 2.
Figure 3B:
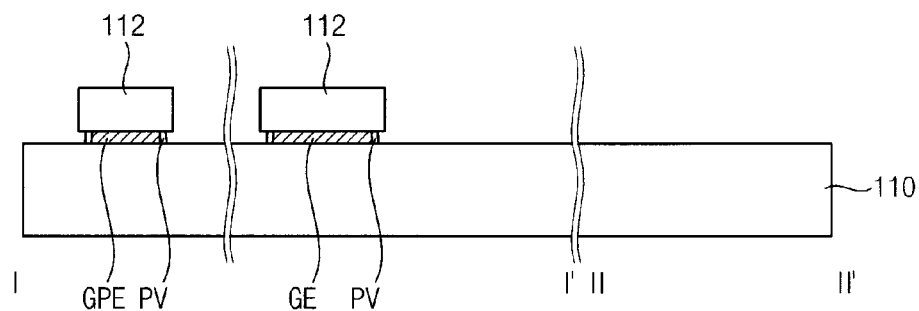

Referring to FIGS. 3A and 3B, a gate metal layer 111 is formed on a base substrate 110, and a first photoresist pattern 112 is formed on the gate metal layer 111. The gate metal layer 111 is, for example, a single-layered metal layer including copper or a copper alloy.

The gate metal layer 111 is etched by using the first photoresist pattern 112 as an etching mask and using an etchant to form a gate line GL, a gate electrode GE and a gate pad electrode GPE. The etchant used for etching the gate metal layer 111 includes, for example, phosphoric acid, nitric acid, acetic acid, a corrosion inhibition agent and water. The etchant is substantially the same as the previously explained etchant according to an example embodiment of the present invention. Thus, any repeated explanation will be omitted.

When the etchant is used for etching the gate metal layer 111, a skew of a metal pattern formed from the gate metal layer 111 may not be increased even if the thickness of the gate metal layer 111 is increased or even if an etching time is increased.

Particularly, when the etchant is sprayed to the gate metal layer 111, the corrosion inhibition agent, for example, benzotriazole, in the etchant is adhered to an exposed side surface of the gate metal layer 111. A portion of the gate metal layer 111, which is not covered by the first photoresist pattern 112, is physically etched by a spraying pressure greater than about 0.1 Mpa. A side surface of a portion of the gate metal layer 111, which is covered by the first photoresist pattern 112, is exposed to the etchant as the portion of the gate metal layer 111, which is not covered by the first photoresist pattern 112, is etched. However, a pressure of the etchant applied to the side surface of the gate metal layer 111 is smaller than the pressure of the etchant applied to the portion of the gate metal layer 111, which is not covered by the photoresist pattern 112. Thus, benzotriazole of the etchant is combined with the copper or the copper alloy of the gate metal layer 111 according to the following Reaction Formula 1 so that benzotriazole of the etchant is adhered to the side surface of the gate metal layer 111. Thus, a protective layer PV is formed on side surfaces of the gate line GL, the gate electrode GE and the gate pad electrode GPE.

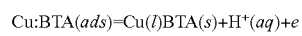    Reaction Formula 1

The gate metal layer 111 may be partially etched under an end of the first photoresist pattern 112 because a pressure of the etchant applied to the gate metal layer 111 under the end of the first photoresist pattern 112 is not sufficiently small so that the protective layer PV is not formed.

According to the method of manufacturing a display substrate, a side surface of the gate metal layer 111, which is exposed to an etchant in an etching process, is protected by the protective layer PV. Thus, even if an etching time for the gate metal layer 111 is increased, over-etching of the gate metal layer 111 may be prevented. Thus, even if an etching time for the gate metal layer 111 is increased, or even if a thickness of the gate metal layer 111 is increased, a length of a skew caused by over-etching of the gate metal layer 111 is not increased. According to the present example embodiment of the present invention, over-etching of the gate metal layer 111 may be prevented. Thus, a margin of a pitch between first photoresist patterns 112 may be sufficiently obtained, and the gate line GL, the gate electrode GE and the gate pad electrode GPE may have a relatively large thickness and a relatively small width. Thus, a fine pattern having a low resistance may be formed.

Figure 3C:
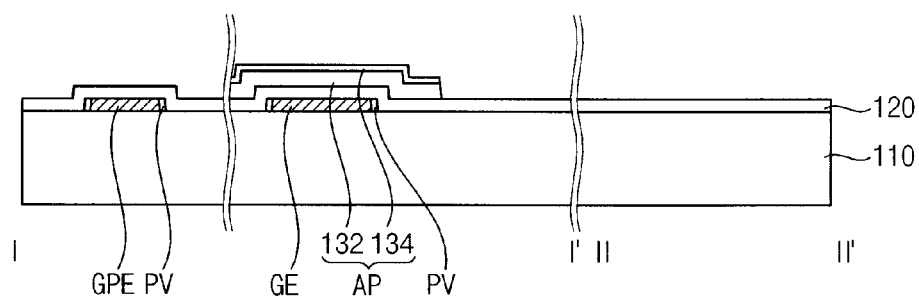

Referring to FIG. 3C, a first insulating layer 120 is formed on the base substrate 110 having the gate line GL, the gate electrode GE and the gate pad electrode GPE, and an active pattern AP including a semiconductor layer 132 and an ohmic contact layer 134 is formed on the first insulating layer 120 by using, for example, a mask.

Figure 3D:
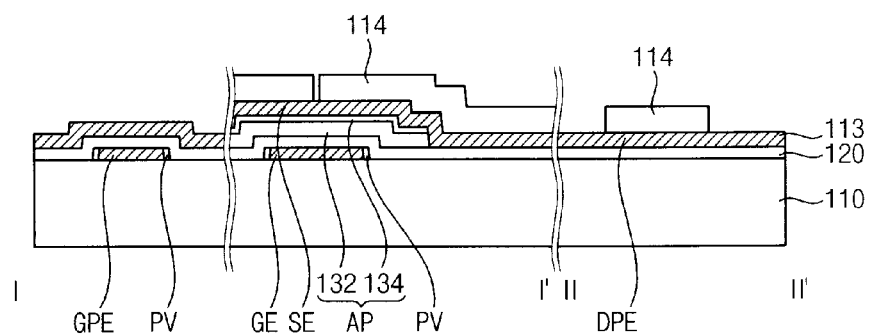

Referring to FIG. 3D, a data metal layer 113 is formed on the base substrate 110 having the active pattern AP, and a second photoresist pattern 114 is formed on the data metal layer 113. The data metal layer 113 is, for example, a single-layered metal layer including copper or a copper alloy.

The data metal layer 113 is etched by an etchant using the second photoresist pattern 114 as an etching mask to form a data line DL, a source electrode SE, a drain electrode DE and a data pad electrode DPE. The etchant used for etching the data metal layer 113 includes, for example, phosphoric acid, nitric acid, acetic acid, a corrosion inhibition agent and water. The etchant is substantially the same as the previously explained etchant according to an example embodiment of the present invention. Thus, any repeated explanation will be omitted. Furthermore, a method for etching the data metal layer 113 to form the data line DL, the source electrode SE, the drain electrode DE and the data pad electrode DPE is substantially the same as the previously explained method for etching the gate metal layer 111 to form the gate line GL, the gate electrode GE and the gate pad electrode GPE. Thus, any repeated explanation will be omitted.

According to the present example embodiment of the present invention, over-etching of the data metal layer 113 may be prevented. Thus, a margin of a pitch between second photoresist patterns 114 may be sufficiently obtained, and the data line DL, the source electrode SE, the drain electrode DE and the data pad electrode DPE may have a relatively large thickness and a relatively small width. Thus, a fine pattern having a low resistance may be formed.

Figure 3E:
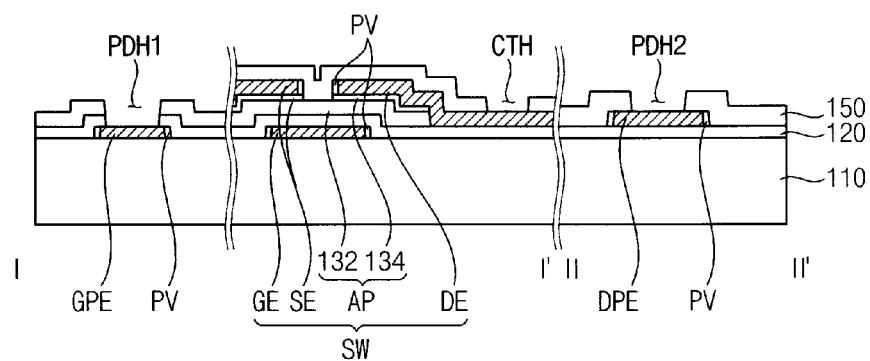

Referring to FIG. 3E, a second insulating layer 150 is formed on the base substrate 110 having the data line DL, the source electrode SE, the drain electrode DE and the data pad electrode DPE. A first pad hole PDH1, a second pad hole PDH2 and a contact hole CTH are formed through the first and second insulating layers 120 and 150 by using, for example, a mask. Particularly, the first pad hole PDH1 is formed through the first and second insulating layers 120 and 150 to expose a portion of the gate pad electrode GPE, and the second pad hole PDH2 is formed through the second insulating layer 150 to expose a portion of the data pad electrode DPE. The contact hole CTH is formed through the second insulating layer 150 to expose a portion of the drain electrode DE.

Referring to FIG. 2, a transparent electrode layer is formed on the second insulating layer 150 having the first and second pad holes PDH1 and PDH2 and the contact hole CTH. The transparent electrode layer is patterned to form a pixel electrode PE, a gate contact electrode GCE and a data contact electrode DCE. Particularly, a third photoresist pattern (not shown) is formed by using, for example, a mask, and the transparent electrode layer 115 is etched by using, for example, the third photoresist pattern as an etching mask. Examples of a material that may be used for the transparent electrode layer may include but are not limited to ITO, IZO and the like. Other materials which may be used to form the transparent electrode layer include, for example, a zinc oxide (ZnO) layer, an indium oxide ($In_2O_3$) layer, tin oxide ($SnO_2$) layer, aluminum zinc oxide (AZO) layer or a gallium zinc oxide (GZO) layer.

The pixel electrode PE makes contact with the drain electrode DE through the contact hole CTH. The gate contact electrode GCE makes contact with the gate pad electrode GPE through the first pad hole PDH1, and the data contact electrode DCE makes contact with the data pad electrode DPE through the second pad hole PDH2.

Accordingly, the display substrate 100 illustrated in FIGS. 1 and 2 may be prepared.

According to the above, the etchant according to an example embodiment of the present invention may prevent the gate metal layer 111 including, for example, copper or a copper alloy from being over-etched in the process for forming a gate pattern including the gate line GL, the gate electrode GE and the gate pad electrode GPE. Thus, a length of a skew formed between a lower surface of the first photoresist pattern 112 and etched surfaces of the gate line GL, the gate electrode GE and the gate pad electrode GPE may be maintained within a desired range. Thus, the gate pattern may have a low resistance to be used, for example, in a high-resolution display device and a 3-dimensional display device. Furthermore, a data pattern including the data line DL, the source electrode SE, the drain electrode DE and the data pad electrode DPE may have a low resistance to be used, for example, in a high-resolution display device and a 3-dimensional display device.

Figure 4:
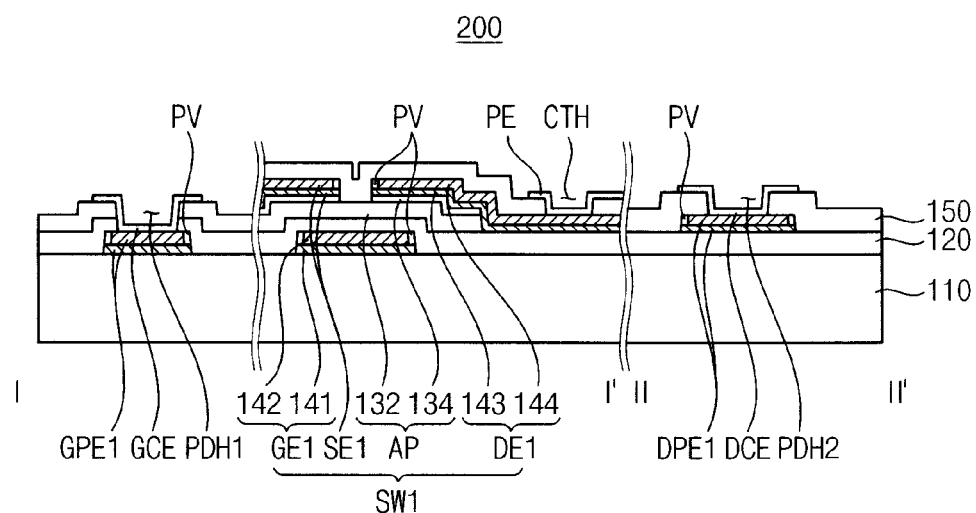
FIG. 4 is a cross-sectional view of a display substrate manufactured according to an example embodiment of the present invention.

FIG. 4 is a cross-sectional view of a display substrate manufactured according to an example embodiment of the present invention.

The display substrate is substantially the same as the display substrate illustrated in FIGS. 1 to 3E except for a gate pattern and a data pattern. Thus, the same reference numerals will be used for same elements as the elements of the display substrate illustrated in FIGS. 1 to 3E, and any repeated explanation will be omitted.

Referring to FIG. 4, a display substrate 200 includes, for example, a gate line, a data line, a switching element SW1 and a pixel electrode PE. The display substrate further includes, for example, a gate pad electrode GPE1 and a data pad electrode DPE1.

The gate line, the gate electrode GE1 and the gate pad electrode GPE1 may be formed from, for example, the same gate metal layer. The gate metal layer includes, for example, a first metal layer 141 formed on a base substrate 110 and a second metal layer 142 deposited on the first metal layer 141. Examples of a material that may be used for the first metal layer 141 may include but are not limited to one of titanium, molybdenum, titanium alloy and molybdenum alloy. For example, the first metal layer 141 may include titanium. Alternatively, in an embodiment, the first metal layer 141 may instead include, for example, one of chromium, aluminum, tungsten or alloys thereof. The second metal layer 142 may include, for example, copper or a copper alloy. The first metal layer 141 may increase the adhesion between the second metal layer 142 and the base substrate 110 and characteristics of the switching element SW. Alternatively, the gate metal layer may have, for example, at least three metal layers, which are sequentially deposited.

The data line, the source electrode SE1, the drain electrode DE1 and the data pad electrode DPE1 may be formed from, for example, the same data metal layer. The data metal layer includes, for example, a third metal layer 143 formed on an ohmic contact layer 134, and a fourth metal layer 144 formed on the third metal layer 143. The third metal layer 143 may include, for example, one of titanium, molybdenum, titanium alloy and molybdenum alloy. For example, the third metal layer 143 may include titanium. Alternatively, in an embodiment, the third metal layer 143 may instead include, for example, one of chromium, aluminum, tungsten or alloys thereof. The fourth metal layer 144 may include, for example, copper or a copper alloy. The third metal layer 143 may increase the adhesion between the fourth metal layer 144 and the ohmic contact layer 134 and characteristics of the switching element SW. Alternatively, the data metal layer may have, for example, at least three metal layers, which are sequentially deposited.

Hereinafter, a method of manufacturing the display substrate illustrated in FIG. 4 using the etchant according to an example embodiment of the present invention will be explained with reference to FIGS. 5A to 5E.

FIGS. 5A to 5E are cross-sectional views illustrating the method of manufacturing the display substrate illustrated in FIG. 4.

Figure 5A:
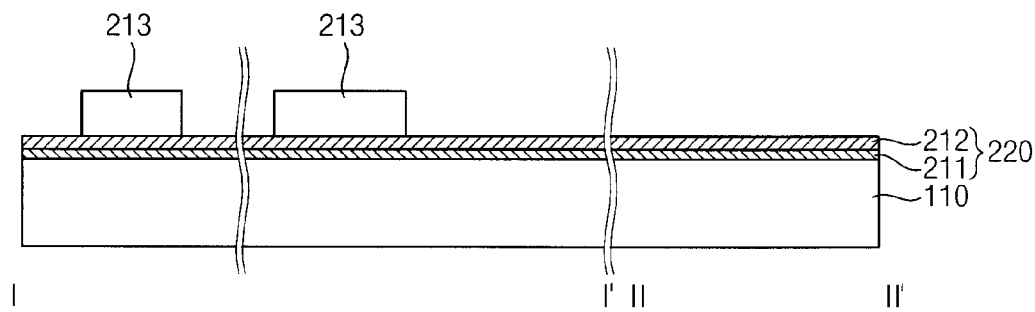
FIGS. 5A to 5E are cross-sectional views illustrating the method of manufacturing the display substrate illustrated in FIG. 4.
Figure 5B:
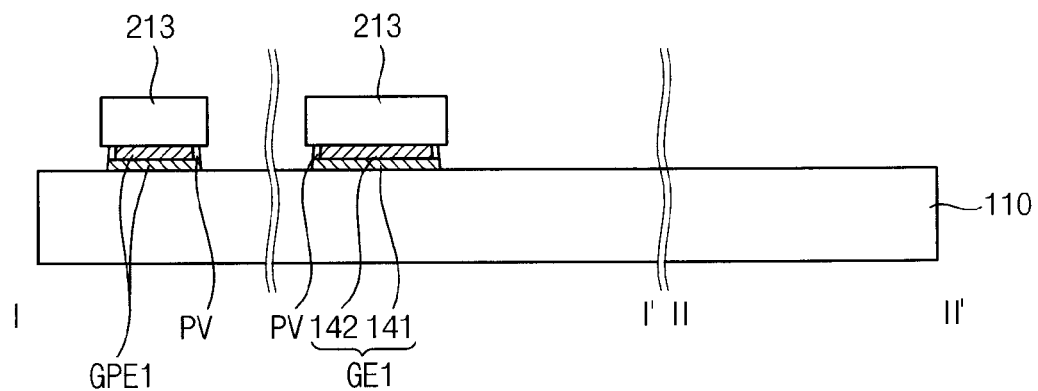

Referring to FIGS. 5A and 5B, a first metal film 211 is formed on a base substrate 110, and a second metal film 212 is formed on the first metal film 211 to form a gate metal layer 220. A first photoresist pattern 213 is formed on the gate metal layer 220. The first metal film 211 may include, for example, one of titanium, molybdenum, titanium alloy and molybdenum alloy. Alternatively, in an embodiment, the first metal film 211 may instead include, for example, one of chromium, aluminum, tungsten or alloys thereof. The second metal film 212 includes, for example, copper. Furthermore, the second metal film 212 including the copper or the copper alloy may be alternatively formed on the base substrate 110 and then the first metal film 211 may be formed on top of the second metal film 212 to form the gate metal layer 220.

The first and second metal films 211 and 212 are etched with each other by an etchant using the first photoresist pattern 213 as an etching mask to form the gate line, the gate electrode GE1 and the gate pad electrode GPE1. The etchant used for etching the first and second metal films 211 and 212 includes, for example, phosphoric acid, nitric acid, acetic acid, a corrosion inhibition agent and water. The etchant is substantially the same as the previously explained etchant according to an example embodiment of the present invention. Thus, any repeated explanation will be omitted.

The etchant may prevent a skew of a metal pattern formed from the gate metal layer 220 from increasing even if a thickness of the gate metal layer 220 is increased or even if an etching time is increased.

Particularly, when the etchant is sprayed to the gate metal layer 220, the corrosion inhibition agent, for example, benzotriazole, in the etchant is adhered to an exposed side surface of the gate metal layer. A portion of the gate metal layer 220, which is not covered by the first photoresist pattern 213, is physically etched by a spraying pressure greater than, for example, about 0.1 Mpa. A side surface of a portion of the gate metal layer 220, which is covered by the first photoresist pattern 213, is exposed to the etchant as the portion of the gate metal layer 220, which is not covered by the first photoresist pattern 213, is etched. However, a pressure of the etchant applied to the side surface of the gate metal layer 220 is smaller than the pressure of the etchant applied to the portion of the gate metal layer 220, which is not covered by the first photoresist pattern 213. Thus, benzotriazole of the etchant is combined with the copper or the copper alloy of the second metal film 212 according to the following Reaction Formula 1 thereby forming a protective layer PV on a side surface of the second metal layer 142 under the first photoresist pattern 213.

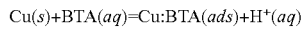

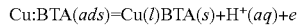     Reaction Formula 1

Furthermore, the first metal layer 141 formed from the first metal film 211 is temporarily oxidized in an etching process so that the first metal layer 141 is prevented from being over-etched. When the first and second metal layers 141 and 142 are etched by the etchant, a voltage difference between the first and second metal layers 141 and 142 is generated because the first and second metal layers 141 and 142 have different materials. Thus, electrons may move from the second metal layer 142 to the first metal layer 141 to increase the etching rate of the second metal layer 142. However, when the first metal layer 141 is temporarily oxidized, electrons moving from the second metal layer 142 to the first metal layer 141 are reduced or prevented so that the second metal layer 132 is prevented form being over-etched.

According to the present example embodiment of the present invention, a margin of a pitch between first photoresist patterns 213 may be sufficiently obtained, and the gate line, the gate electrode GE1 and the gate pad electrode GPE1 may have a double-layered structure having a relatively large thickness and a relatively small width. Thus, a fine pattern having a low resistance may be formed. It is noted that alternatively the structures of each of the gate line, the gate electrode GE1 and the gate pad electrode GPE1 may still further include more than two metal layers. For example, the gate line, the gate electrode GE1 and the gate pad electrode GPE1 may each have a triple-layered structure composed of three metal layers sequentially stacked in which at least one of the metal layers includes copper or a copper alloy.

Figure 5C:
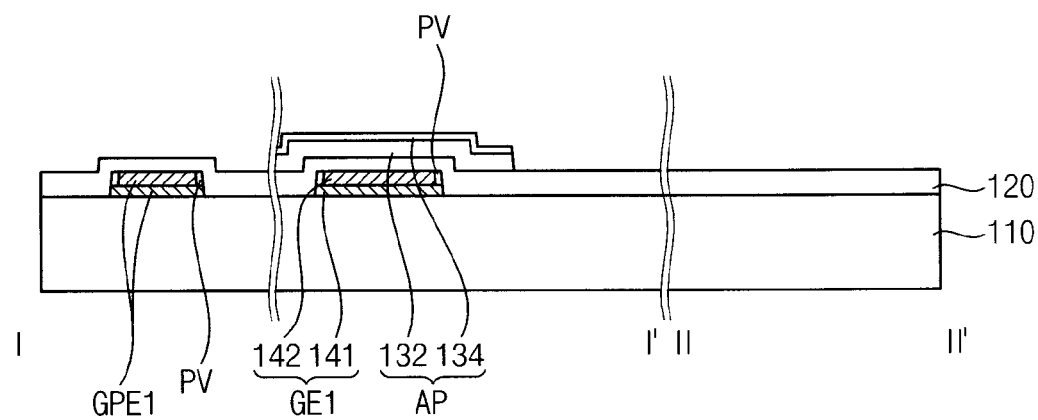

Referring to FIG. 5C, a first insulating layer 120 is formed on the base substrate 110 having the gate line, the gate electrode GE1 and the gate pad electrode GPE1. Thereafter, an active pattern AP including a semiconductor layer 132 and an ohmic contact layer 134 is formed on the first insulating layer 120 by using, for example, a mask.

Figure 5D:
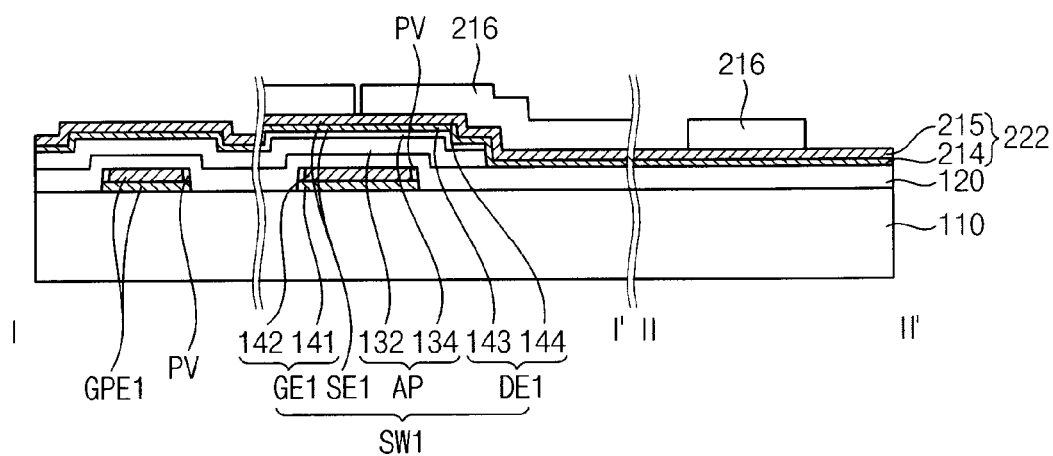

Referring to FIG. 5D, a third metal film 214 is formed on the first insulating layer 120 to cover the active pattern AP, and a fourth metal film 215 is formed on the third metal film 214 to form a data metal layer 222. A second photoresist pattern 216 is formed on the data metal layer 222. The third metal film 214 may include, for example, one of titanium, molybdenum, titanium alloy and molybdenum alloy. The third metal film 214 may include, for example, titanium. Alternatively, the third metal film 214 may instead include, for example, one of chromium, aluminum, tungsten or alloys thereof. The fourth metal film 215 includes, for example, copper or a copper alloy. In an embodiment, the fourth metal film 215 including the copper or the copper alloy may alternatively be formed on the first insulating layer 120 to cover the active pattern AP and the third metal film 214 may be formed on top of the fourth metal film 215 to form the data metal layer 222.

The data metal layer 222 is etched by the etchant using the second photoresist pattern 216 as an etching mask to form a data line, a source electrode SE1, a drain electrode DE1 and a data pad electrode DPE1. The etchant used for etching the data metal layer 222 includes, for example, phosphoric acid, nitric acid, acetic acid, a corrosion inhibition agent and water. The etchant is substantially the same as the previously explained etchant according to an example embodiment of the present invention. Thus, any repeated explanation will be omitted. Furthermore, a method for etching the data metal layer 222 to form the data line, the source electrode SE1, the drain electrode DE1 and the data pad electrode DPE1 is substantially the same as the previously explained method for etching the gate metal layer to form the gate line, the gate electrode GE1 and the gate pad electrode GPE1. Thus, any repeated explanation will be omitted.

According to the present example embodiment of the present invention, a margin of a pitch between second photoresist patterns 216 may be sufficiently obtained, and the data line, the source electrode SE1, the drain electrode DE1 and the data pad electrode DPE1 may have a double-layered structure having a relatively large thickness and a relatively small width. Thus, a fine pattern having a low resistance may be formed. It is noted that alternatively the structures of each of the data line, the source electrode SE1, the drain electrode DE1 and the data pad electrode DPE1 may still further include more than two metal layers. For example, the data line, the source electrode SE1, the drain electrode DE1 and the data pad electrode DPE1 may each have a triple-layered structure composed of three metal layers sequentially stacked in which at least one of the metal layers includes copper or a copper alloy.

Figure 5E:
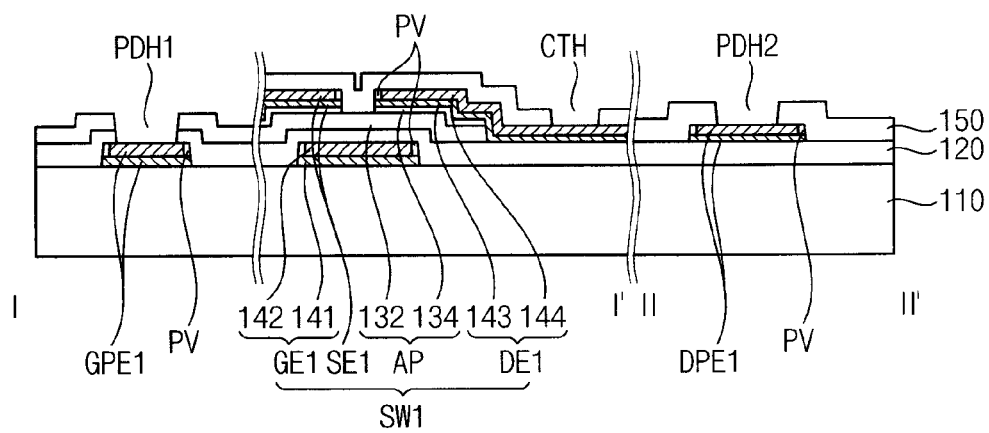

Referring to FIG. 5E, a second insulating layer 150 is formed on the base substrate 110 having the source electrode SE1, the drain electrode DE1, the data line and the data pad electrode DPE1. Thereafter, a first pad hole PDH1 is formed through the first and second insulating layers 120 and 150 to expose a portion of the gate pad electrode GPE1, and a second pad hole PDH2 is formed through the second insulating layer 150 to expose a portion of the data pad electrode DPE1. In addition, a contact hole CTH is formed through the second insulating layer 150 to expose a portion of the drain electrode DE1.

Referring to FIG. 4, a transparent electrode layer is formed on the second insulating layer 150 having the first and second pad holes PDH1 and PDH2 and the contact hole CTH, and then patterned to form a pixel electrode PE, a gate contact electrode GCE and a data contact electrode DCE.

Accordingly, the display substrate 200 illustrated in FIG. 4 is prepared.

According to the above, the etchant according to an example embodiment of the present invention may prevent the gate metal layer including the first metal film 211 including, for example, one of titanium, molybdenum, titanium alloy and molybdenum alloy and the second metal film 212 including, for example, copper or a copper alloy from being over-etched in the process for forming a gate pattern including the gate line, the gate electrode GE1 and the gate pad electrode GPE1. Thus, a length of a skew formed between a lower surface of the first photoresist pattern 213 and etched surfaces of the gate line, the gate electrode GE1 and the gate pad electrode GPE1 may be maintained within a desired range. Thus, the gate pattern may have a low resistance to be used, for example, in a high-resolution display device and a 3-dimensional display device. Furthermore, a data pattern including the data line, the source electrode SE1, the drain electrode DE1 and the data pad electrode DPE1 may have a low resistance to be used, for example, in a high-resolution display device and a 3-dimensional display device.

Example of Etchant

An etchant having a composition according to Table 1 was prepared.

TABLE 1

| | Phosphoric acid | Nitric acid | Acetic acid | BTA | NH$_4$FHF | water |
|---|---|---|---|---|---|---|
| Content (% by weight) | 55 | 5 | 15 | 2 | 0.5 | 22.5 |

Experiment 1 for Skew Length

A substrate including a metal layer containing copper with a thickness of about 0.3 um according to sample 1 was prepared. A photoresist pattern was formed on the metal layer and patterned by the etchant prepared according to Table 1 by using the photoresist pattern as an etching mask. Thereafter, a skew length between an end of the photoresist pattern and an etched surface of the metal layer was measured, and thus obtained results are shown by line A of FIG. 6.

A substrate including a metal layer containing copper with a thickness of about 0.7 um according to sample 2 was prepared. A photoresist pattern was formed on the metal layer and patterned by the etchant prepared according to Table 1 by using the photoresist pattern as an etching mask. Thereafter, a skew length between an end of the photoresist pattern and an etched surface of the metal layer was measured, and thus obtained results are shown by line B of FIG. 6.

A substrate including a metal layer containing copper with a thickness of about 2.0 um according to sample 3 was prepared. A photoresist pattern was formed on the metal layer and patterned by the etchant prepared according to Table 1 by using the photoresist pattern as an etching mask. Thereafter, a skew length between an end of the photoresist pattern and an etched surface of the metal layer was measured, and thus obtained results are shown by line C of FIG. 6.

Figure 6:
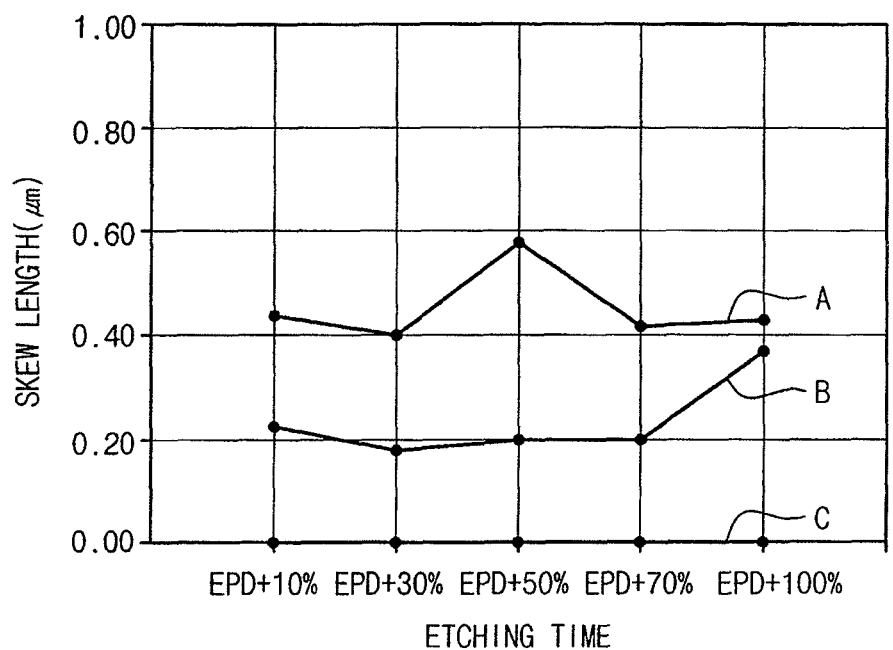
FIG. 6 is a graph showing skew lengths of samples 1 to 3 with respect to an etching time.

FIG. 6 is a graph showing skew lengths of samples 1 to 3 with respect to an etching time, which were measured after the metal layers of samples 1 to 3 were etched by the etchant prepared according to Table 1. Particularly, the x coordinate represents an etching time with a unit of seconds, and the y coordinate represents a skew length with a unit of um.

Referring to the line A of FIG. 6, when the skew lengths of the metal layer of sample 1 were measured after a lapse of time for over-etching of about 10%, about 30%, about 50%, about 70% and about 100% from an end time of etching the metal layer of sample 1, the measured skew lengths were respectively about 0.42 um, about 0.4 um, about 0.58 um, about 0.41 um and about 0.43 um. The end times of etching the metal layer of sample 1 were measured by an end point detector (EPD) in connection with line A of FIG. 6. Thus, it can be noted that the skew length of the metal layer of sample 1 was almost maintained even as the etching time was increased. Furthermore, the skew length of the metal layer of sample 1 was short with compared to a skew length formed by a conventional non-peroxide etchant. Thus, it can be noted that the metal layer of sample 1 was not over-etched even as the etching time was increased.

Referring to the line B of FIG. 6, when skew lengths of the metal layer of sample 2 were measured after a lapse of time for over-etching of about 10%, about 30%, about 50%, about 70% and about 100% from an end time of etching the metal layer of sample 2, the measured skew lengths were respectively about 0.21 um, about 0.19 um, about 0.2 um, about 0.2 um and about 0.38 um. The end times of etching the metal layer of sample 2 were measured by the EPD in connection with line B of FIG. 6. Thus, it can be noted that the skew length of the metal layer of sample 2 was short with compared to the skew length of the metal layer of sample 1 and was almost maintained even as the etching time was increased.

Referring to the line C of FIG. 6, when the skew lengths of the metal layer of sample 3 were measured after a lapse of time for over-etching of about 10%, about 30%, about 50%, about 70% and about 100% from an end time of etching the metal layer of sample 3, the measured skew lengths were respectively about 0 um. The end times of etching the metal layer of sample 3 were measured by the EPD in connection with line C of FIG. 6. Thus, it can be noted that the skew length of the metal layer of sample 3 was short compared to the skew length of the metal layers of samples 1 and 2 and was almost maintained even as the etching time was increased.

According to the above, the skew lengths of the metal layers of samples 1 to 3 were almost maintained even as the etching time was increased. The skew lengths of the metal layers of samples 1 to 3 were not same as each other. However, the skew lengths of the metal layers of samples 1 to 3 may be within a functionally equivalent range in view of a process environment. Thus, it can be noted that the etchant according to an example of the present invention may etch metal layers including copper and having different thicknesses without increasing a skew length.

Experiment 2 for Skew Length

A photoresist pattern was formed on each of the substrates having the metal layer containing copper according to samples 1 to 3 and then patterned by the etchant prepared according to Table 1 by using the photoresist pattern as an etching mask to form a metal pattern. The photoresist pattern and the metal pattern were photographed by a scanning electron microscope (SEM) to measure a skew length between an end of the photoresist pattern and an end of the metal pattern, and a taper angle of an etched surface of the metal pattern. Thus obtained results are shown in FIGS. 7A to 7C.

Figure 7A:
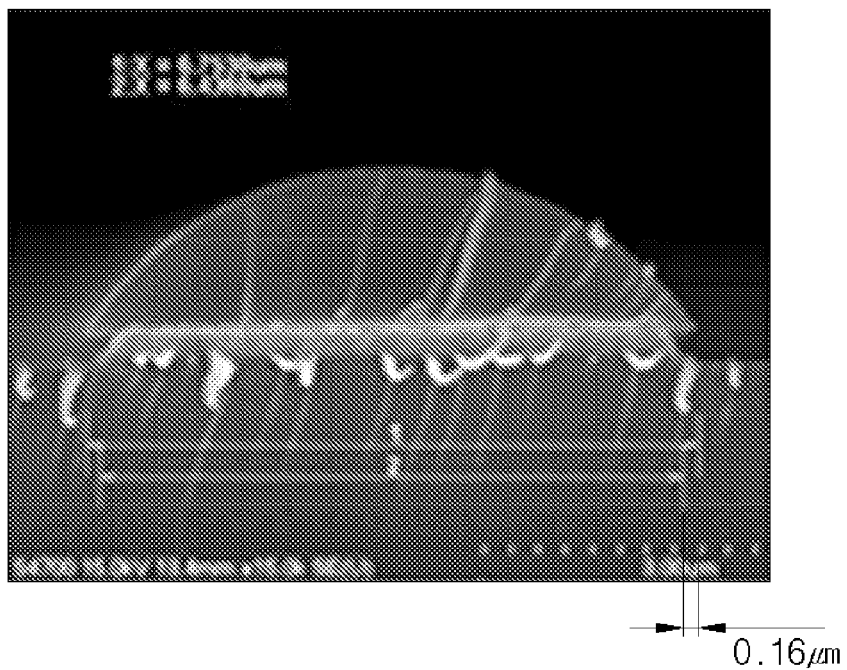
FIGS. 7A to 7C are photographs showing the metal patterns formed from the metal layers of samples 1 to 3.
Figure 7B:
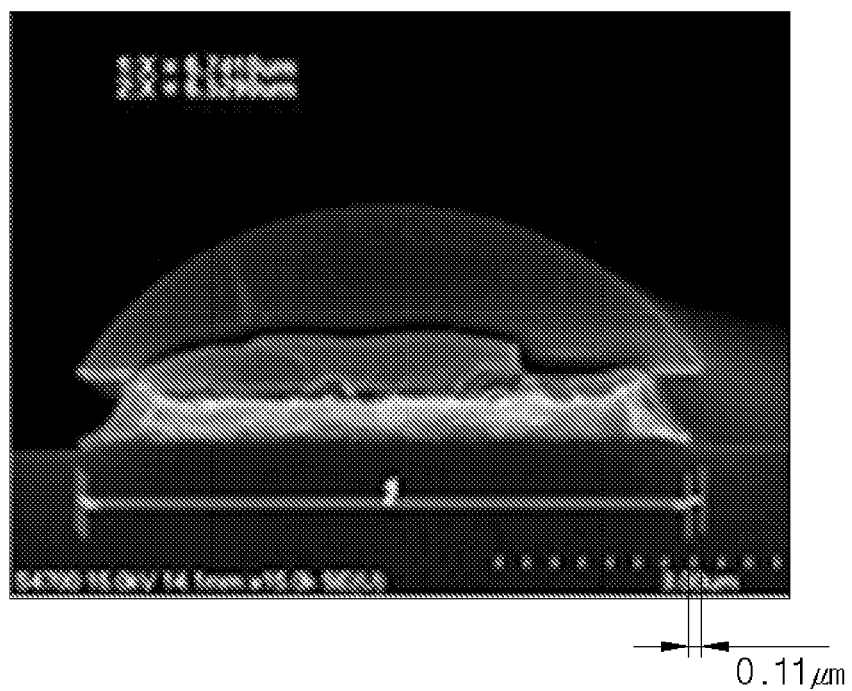
Figure 7C:
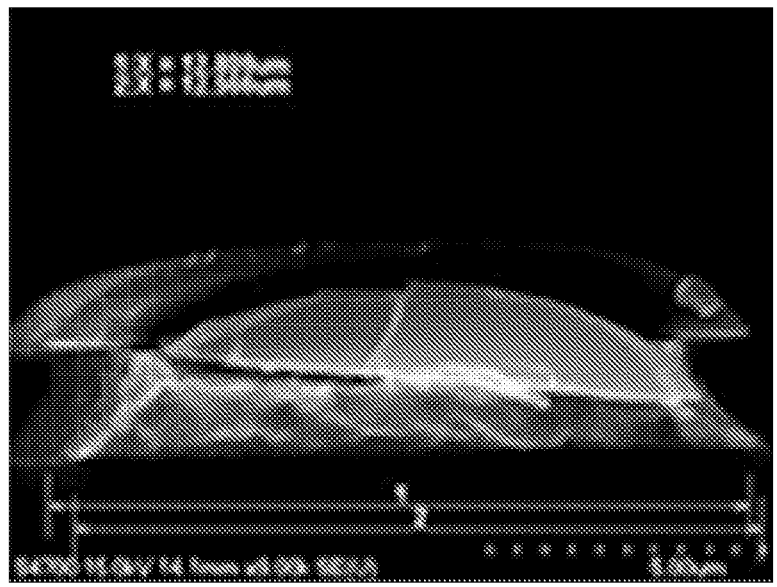

FIGS. 7A to 7C are photographs showing the metal patterns formed from the metal layers of samples 1 to 3, which were etched by the etchant prepared according to Table 1.

FIG. 7A is a photograph showing the metal pattern formed from the metal layer of sample 1. The skew length between an end of the photoresist pattern and an end of the metal pattern was about 0.16 um, and a taper angle of an etched surface of the metal pattern was about 50 degrees.

FIG. 7B is a photograph showing the metal pattern formed from the metal layer of sample 2. The skew length between an end of the photoresist pattern and an end of the metal pattern was about 0.11 um, and a taper angle of an etched surface of the metal pattern was about 50 degrees.

FIG. 7C is a photograph showing the metal pattern formed from the metal layer of sample 3. The metal pattern was shifted from the photoresist pattern in a right direction. The skew length between an end of the photoresist pattern and an end of the metal pattern was about 0 um, and a taper angle of an etched surface of the metal pattern was about 50 degrees.

Referring to FIGS. 7A to 7C, it can be noted that the skew length of the metal patterns formed from the metal layers etched by the etchant according to an example of the present invention may be within a desired range, which is about 2.0 um.

Experiment for Cumulative Treatable Amount

A photoresist pattern was formed on the substrate having the metal layer containing copper according to sample 3 and then patterned by the etchant prepared according to Table 1 by using the photoresist pattern as an etching mask. A skew length of the metal layer and a taper angle (T/A) of an etched surface of the metal layer was measured with respect to a cumulative treatable amount after a lapse of time for over-etching of about 80% from an end time of etching the metal layer of sample 3. The end times of etching the metal layer of sample 3 were measured with respect to the cumulative treatable amount by the EPD. Thus obtained results are shown by line D and E in FIG. 8.

A photoresist pattern was formed on the substrate having the metal layer containing copper according to sample 3 and then patterned by the etchant prepared according to Table 1 by using the photoresist pattern as an etching mask. A skew length of the metal layer and a taper angle (T/A) of an etched surface of the metal layer was measured with respect to a cumulative treatable amount after a lapse of time for over-etching of about 120% from an end time of etching the metal layer of sample 3. The end times of etching the metal layer of sample 3 were measured with respect to the cumulative treatable amounts by the EPD. Thus obtained results are shown by line F and G in FIG. 8.

A photoresist pattern was formed on the substrate having the metal layer containing copper according to sample 3 and then patterned by the etchant prepared according to Table 1 by using the photoresist pattern as an etching mask. The end times of etching the metal layer of sample 3 were measured with respect to cumulative treatable amounts by the EPD. Thus obtained results are shown by line H in FIG. 8.

Figure 8:
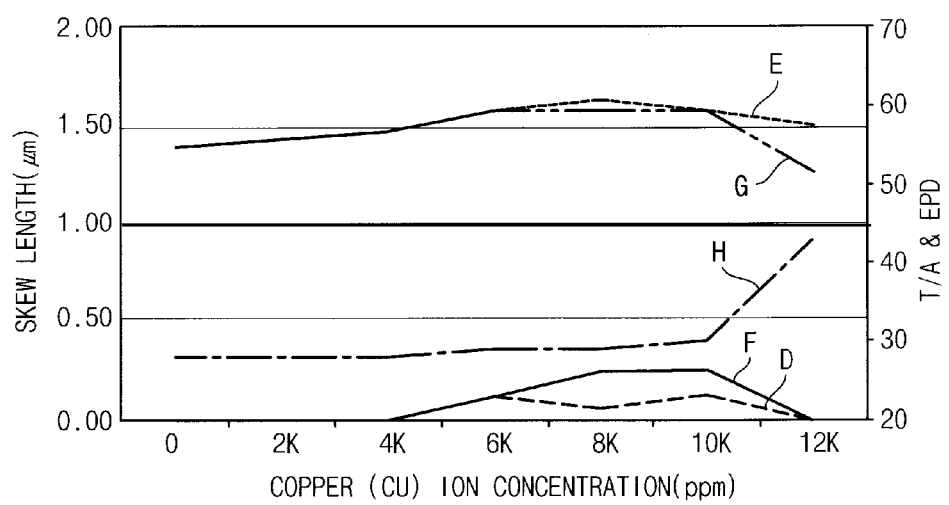
FIG. 8 is a graph showing a skew length, a taper angle and an etching-end time of sample 3 with respect to a cumulative treatable amount.

FIG. 8 is a graph showing a skew length, a taper angle and an etching-end time of sample 3 with respect to a cumulative treatable amount, which were measured after the metal layer of sample 3 was etched by the etchant prepared according to Table 1. Particularly, the x coordinate represents a concentration of copper (Cu) ions corresponding to the cumulative treatable amount with a unit of ppm, and the y coordinate represents the skew length with a unit of um, and the taper angle with a unit of degrees, and the etching-end time with a unit of seconds.

Referring to line D of FIG. 8, when the skew lengths of the metal layer of sample 3 were measured after a lapse of time for over-etching of about 80% from the end time of etching the metal layer of sample 3, the measured skew lengths with respect to the cumulative treatable amounts of about 0 ppm, about 2,000 ppm, about 4,000 ppm, about 6,000 ppm, about 8,000 ppm, about 10,000 ppm and about 12,000 ppm were respectively about 0 um, about 0 um, about 0 um, about 0.13 um, about 0.1 um, about 0.13 um and about 0 um. The end times of etching the metal layer of sample 3 were measured with respect to the cumulative treatable amount by the EPD in connection with line D of FIG. 8. Thus, it can be noted that the skew lengths were increased between about 8,000 ppm and about 10,000 ppm.

Referring to line E of FIG. 8, when the taper angles of the metal layer of sample 3 were measured after a lapse of time for over-etching of about 80% from the end time of etching the metal layer of sample 3, the measured taper angles with respect to the cumulative treatable amounts of about 0 ppm, about 2,000 ppm, about 4,000 ppm, about 6,000 ppm, about 8,000 ppm, about 10,000 ppm and about 12,000 ppm were respectively about 55°, about 56°, about 57°, about 59°, about 59°, about 60° and about 58°. The end times of etching the metal layer of sample 3 were measured with respect to the cumulative treatable amounts by the EPD in connection with line E of FIG. 8. Thus, it can be noted that the taper angle was not changed a lot although the cumulative treatable amount was increased.

Referring to line F of FIG. 8, when the skew lengths of the metal layer of sample 3 were measured after a lapse of time for over-etching of about 120% from the end time of etching the metal layer of sample 3, the measured skew lengths with respect to the cumulative treatable amounts of about 0 ppm, about 2,000 ppm, about 4,000 ppm, about 6,000 ppm, about 8,000 ppm, about 10,000 ppm and about 12,000 ppm were respectively about 0 um, about 0 um, about 0 um, about 0.13 um, about 0.25 um, about 0.26 um and about 0 um. The end times of etching the metal layer of sample 3 were measured with respect to the cumulative treatable amounts by the EPD in connection with line F of FIG. 8. Thus, it can be noted that the skew length was increased between about 8,000 ppm and about 10,000 ppm.

Referring to line G of FIG. 8, when the taper angles of the metal layer of sample 3 were measured after a lapse of time for over-etching of about 120% from the end time of etching the metal layer of sample 3, the measured taper angles with respect to the cumulative treatable amounts of about 0 ppm, about 2,000 ppm, about 4,000 ppm, about 6,000 ppm, about 8,000 ppm, about 10,000 ppm and about 12,000 ppm were respectively about 55°, about 56°, about 57°, about 59°, about 60°, about 60° and about 51°. The end times of etching the metal layer of sample 3 were measured with respect to the cumulative treatable amounts by the EPD in connection with line G of FIG. 8. Thus, it can be noted that the taper angle was reduced when the cumulative treatable amount was about 10,000 ppm.

Referring to line H of FIG. 8, the etching-end times of the metal layer of sample 3 with respect to the cumulative treatable amounts of about 0 ppm, about 2,000 ppm, about 4,000 ppm, about 6,000 ppm, about 8,000 ppm, about 10,000 ppm and about 12,000 ppm were respectively about 28 seconds, about 28 seconds, about 28 seconds, about 29 seconds, about 29 seconds, about 30 seconds and about 40 seconds. The end times of etching the metal layer of sample 3 were measured with respect to the cumulative treatable amounts by the EPD in connection with line H of FIG. 8. Thus, it can be noted that the etching-end time was steeply increased when the cumulative treatable amount was no less than about 10,000 ppm.

Referring to FIG. 8, the skew lengths and the taper angles of the metal layer of sample 3, when the cumulative treatable amounts were no less than about 10,000 ppm, were substantially the same as when the cumulative treatable amounts were smaller than about 10,000 ppm. However, the etching-end times were steeply increased when the cumulative treatable amounts were no less than about 10,000 ppm. Thus, it can be noted that a cumulative treatable amount of the etchant according to an example of the present invention is about 10,000 ppm, which is higher with compared to a cumulative treatable amount of a conventional etchant. Therefore, an etchant according to an example of the present invention may reduce manufacturing costs.

According to the above, a metal layer including copper may be etched by a same etchant even if a thickness of the metal layer is changed.

Furthermore, a skew length of the metal layer including copper is reduced so that a fine pattern having a low resistance may be formed.

Furthermore, a cumulative treatable amount is increased to reduce manufacturing costs.

Having described example embodiments of the present invention, it is further noted that it is readily apparent to those of reasonable skill in the art that various modifications may be made without departing from the spirit and scope of the invention which is defined by the metes and bounds of the appended claims.

What is claimed is:

1. An etchant comprising:
    about 50% by weight to about 70% by weight of phosphoric acid;
    about 1% by weight to about 5% by weight of nitric acid;
    about 10% by weight to about 20% by weight of acetic acid;
    about 0.1% by weight to about 2% by weight of a corrosion inhibition agent including an azole-based compound;
    an additive including one of a surfactant or a sequestering agent; and
    a remainder of water.

2. The etchant of claim 1, wherein the corrosion inhibition agent includes at least one selected from the group consisting of aminotetrazole, benzotriazole, tolytriazole, pyrazole, pyrrole, imidazole, 2-methyl imidazole, 2-ethyl imidazole, 2-propyl imidazole, 2-amino imidazole, 4-metyl imidazole, 4-ethyl imidazole and 4-propyl imidazole.

3. The etchant of claim 1, wherein the corrosion inhibition agent includes benzotriazole.

4. The etchant of claim 1, further comprising about 0.2% by weight to about 2% by weight of a fluorine-containing compound.

5. The etchant of claim 1, wherein the additive is included in an amount of about 0.0001% to about 0.01% by weight.

6. A method of manufacturing a display substrate, the method comprising:
    forming a metal layer including copper or a copper alloy on a substrate; and
    forming a metal pattern by patterning the metal layer using an etchant, the etchant comprising about 50% by weight to about 70% by weight of phosphoric acid, about 1% by weight to about 5% by weight of nitric acid, about 10% by weight to about 20% by weight of acetic acid, about 0.1% by weight to about 2% by weight of a corrosion inhibition agent including an azole-based compound, an additive including one of a surfactant or a sequestering agent and a remainder of water.

7. The method of claim 6, wherein the corrosion inhibition agent includes at least one selected from the group consisting of aminotetrazole, benzotriazole, tolytriazole, pyrazole, pyrrole, imidazole, 2-methyl imidazole, 2-ethyl imidazole, 2-propyl imidazole, 2-amino imidazole, 4-metyl imidazole, 4-ethyl imidazole and 4-propyl imidazole.

8. The method of claim 6, wherein the corrosion inhibition agent includes benzotriazole.

9. The method of claim 6, wherein the etchant further comprises about 0.2% by weight to about 2% by weight of a fluorine-containing compound.

10. The method of claim 6, wherein the metal layer includes one of a single-layered structure including a copper layer or a copper alloy layer, a double-layered structure including a copper layer or a copper alloy layer disposed on a molybdenum layer, a double-layered structure including a copper layer or copper alloy layer disposed on a titanium layer, a double-layered structure including a copper layer or copper alloy layer disposed on a molybdenum alloy layer or a double-layered structure including a copper layer or a copper alloy layer disposed on a titanium alloy layer.

11. The method of claim 6, wherein the forming of the metal pattern comprises forming a protective layer on an etched surface of the metal pattern, and wherein the protective layer includes benzotriazole combined with the copper or the copper alloy.

12. The method of claim 6, wherein the forming of the metal layer comprises forming a gate metal layer on the substrate, and the gate metal layer is patterned by the etchant to form a gate line and a gate electrode.

13. The method of claim 6, wherein the forming of the metal layer comprises forming a data metal layer on the substrate, and the data metal layer is patterned by the etchant to form a data line, a source electrode and a drain electrode.

* * * * *